United States Patent [19]

Sochor

[11] 4,072,387

[45] Feb. 7, 1978

[54] MULTIPLE CONDUCTOR CONNECTOR UNIT AND CABLE ASSEMBLY

[75] Inventor: Jerzy R. Sochor, Hermosa Beach, Calif.

[73] Assignee: Spectra-Strip Corporation, Garden Grove, Calif.

[21] Appl. No.: 659,892

[22] Filed: Feb. 20, 1976

[51] Int. Cl.[2] ........................ H05K 1/07; H01R 13/54

[52] U.S. Cl. ........................... 339/91 R; 339/176 MF

[58] Field of Search .............. 339/17 C, 17 CF, 17 L, 339/17 LC, 17 F, 18 B, 91 R, 176 MF, 65

[56] References Cited

U.S. PATENT DOCUMENTS

| | | | |
|---|---|---|---|
| 2,899,669 | 8/1959 | Johanson | 339/91 R |
| 3,566,336 | 2/1971 | Johnson et al. | 339/91 R |
| 3,731,251 | 5/1973 | Sinclair | 339/17 F |
| 3,731,254 | 5/1973 | Key | 339/17 F |
| 3,744,009 | 7/1973 | Teagno et al. | 339/91 R |
| 3,951,501 | 4/1976 | Bauerle et al. | 339/91 R |

FOREIGN PATENT DOCUMENTS

| | | | |
|---|---|---|---|
| 1,488,690 | 6/1967 | France | 339/17 F |
| 1,929,219 | 1/1970 | Germany | 339/128 |

*Primary Examiner*—Roy Lake
*Assistant Examiner*—Neil Abrams
*Attorney, Agent, or Firm*—I. Morley Drucker

[57] ABSTRACT

This disclosure is directed to a connector unit which has the capability of mating a plurality of side by side insulated conductors (usually in the form of a multiconductor, flat, flexible, bonded or laminated cable) with a plurality of similarly spaced contact pad areas on a printed circuit board (PCB). The multi-conductor cable is mated to the PCB in a quick-connect manner and enables also a quick-disconnect, or separation of the cable assembly, from the PCB, to be accomplished with one hand only, and with no tooling required. The resulting contact pressure between the PCB and the leads of the multi-conductor cable is above a certain predetermined minimum and is reproducible, even after repetitive quick-connect and disconnects of connector unit from the PCB. The mating of the connector unit to the PCB is accomplished with low insertion force. Further, the connector unit is capable of electrically engaging a PCB of varying thickness. The foregoing is accomplished by a precise pin-type alignment means between connector unit and the PCB in combination with an elongated spring clip affixed to the connector unit, which spring clip engages the PCB, under a predetermined contact pressure, after the pin-type alignment is achieved. Also, there may be provided, within the connector unit, and in combination with the cable assembly, a means for providing alternating ground lines between adjacent signal lines, to reduce cross-talk. The connector unit is provided with spring loaded electrical contact strips on the signal lines to assure uniform contact pressure with the contact areas of the PCB.

24 Claims, 10 Drawing Figures

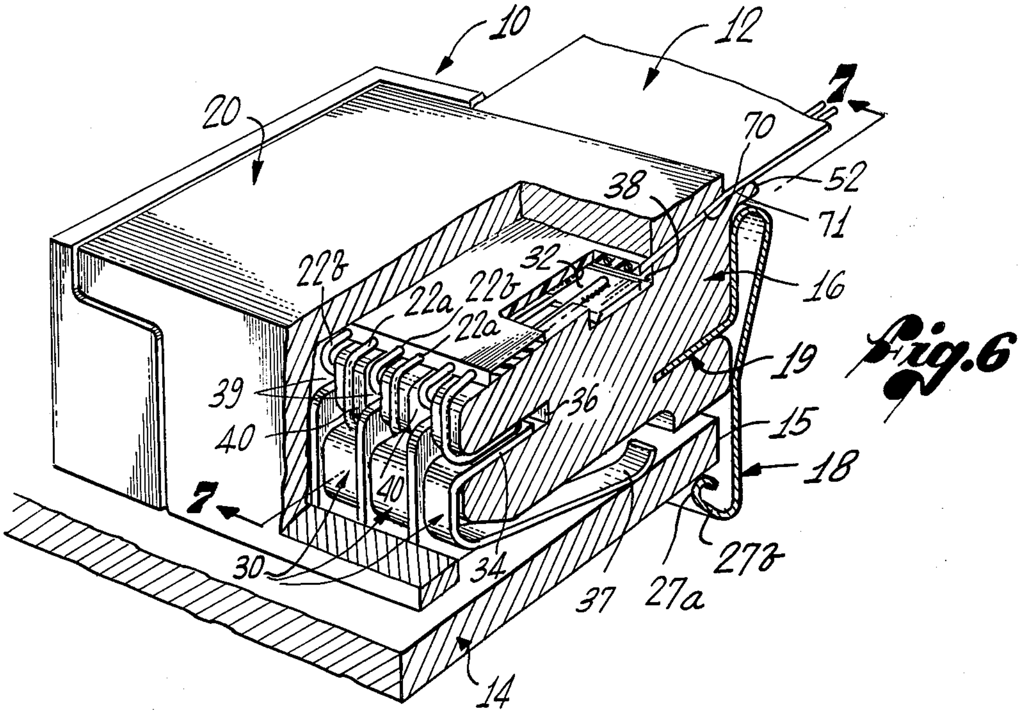
Fig.6
Fig.7
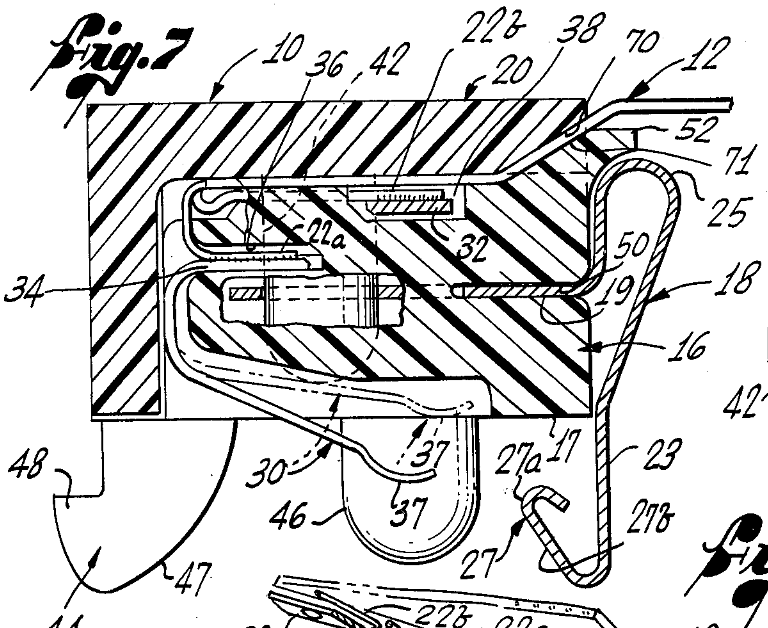
Fig.10
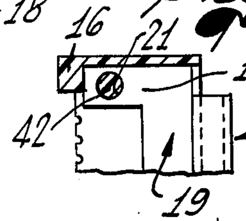
Fig.8
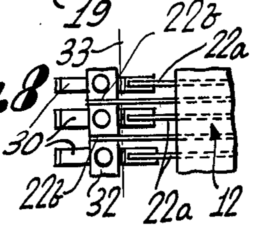
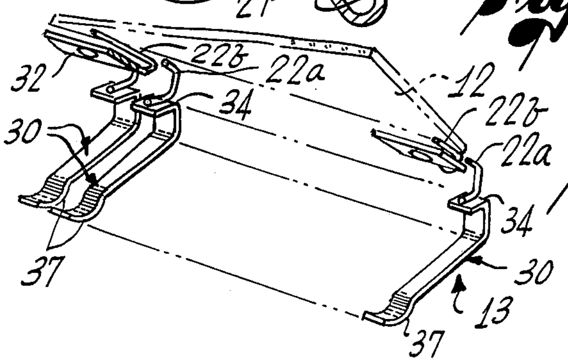
Fig.9

MULTIPLE CONDUCTOR CONNECTOR UNIT AND CABLE ASSEMBLY

BACKGROUND OF THE INVENTION

The electronic data transmission industry, for example, those involved with computer manufacture and telephone equipment manufacture have a particular need for a quick-connect and quick disconnect reliable, repetitive and reproducible electrical mating of a multiplicity of closely adjacent contact areas on printed circuit boards (or printed wiring boards) to multiple, insulated, conductor cable which is flexible but initially flat. Such multiple-conductor cable may have the insulated conductors thereof individually bonded to each other as exemplified by Lang, U.S. Pat. No. 3,208,896, or the individual conductors may be laminated between plastic sheets, as exemplified by U.S. Pat. No. 3,082,092 to achieve insulation of the individual conductors. Many other industries have similar requirements.

This invention provides a connector unit and combined connector unit and harness assembly which fills the foregoing stated requirements in a simplified and economical manner.

BRIEF SUMMARY OF THE INVENTION

The connector of this invention has the capability of mating a plurality of side by side insulated conductors (usually in the form of a multi-conductor, flat, flexible, bonded or laminated cable) with a plurality of similarly spaced contact pad areas on a printed circuit board (PCB). The connector unit, herein to be described, enables a multi-conductor cable to be mated to the PCB in a quick-connect manner and enables also a quick-disconnect from the PCB to be accomplished with one hand only, and without tooling.

The foregoing is accomplished by a precise pin-type alignment means between connector unit and the PCB in combination with an elongated spring clip affixed to the connector unit, which spring clip engages the PCB and fixedly mounts the PCB to the connector unit, under a predetermined pressure, after the pin-type alignment is achieved. The resulting contact pressure between the PCB and the leads of the multi-conductor cable is above a certain predetermined minimum and is reproducible, even after repetitive quick-connect and disconnects of the connector unit from the PCB. Further, the connector unit is capable of electrically engaging a PCB of varying thickness (e.g., of from 0.044 inches to 0.073 inches).

The multi-conductor cable, to be mated to the PCB, has its lead lines, or signal lines, soldered, or otherwise affixed to spring-loaded contact strips, and is mounted within the connector unit such that the spring-loaded contact strips engage, under a predetermined minimum pressure, the contact areas of the PCB when the spring clip fixedly mounts the PCB to the connector unit. The combination of spring-loaded electrical contact strips on the signal lines of the cable and the spring clip mounting of PCB to connector unit assure uniform contact pressure of the contact strips with the contact areas of the PCB.

The mating of the connector unit to the PCB is accomplished with low insertion force, by rotating the connector unit into mating position with the contact pad areas of the PCB.

Also, there may be provided, within the connector unit, and in combination with the cable assembly, a simplified means for providing alternating ground lines between adjacent signal lines, to reduce cross-talk between signal lines.

BRIEF DESCRIPTION OF THE DRAWINGS

FIG. 6 is a fragmentary, cross-sectional perspective view of the connector unit of this invention mating a flexible, generally flat, multi-conductor cable to a PCB;

FIG. 7 is a cross-sectional view of the connector unit, taken along the line 7—7 of FIG. 6, but prior to the insertion of the PCB;

FIG. 8 is a fragmentary, top plan view, showing a first step in the termination of one embodiment of the multi-conductor cable to spring contact members and to a grounded strip, prior to its mating to the connector unit.

FIG. 9 is a fragmentary, perspective view of a second step in the cable assembly of the spring contact strips and ground strip to a multi-conductor cable, prior to mating to a connector unit; and FIG. 10 is a fragmentary, top plan view, partially in cross-section, taken along the line 10—10 of FIG. 7, showing the manner of retaining the spring clip within the connector unit.

DETAILED DESCRIPTION OF THE INVENTION

Figure 1:
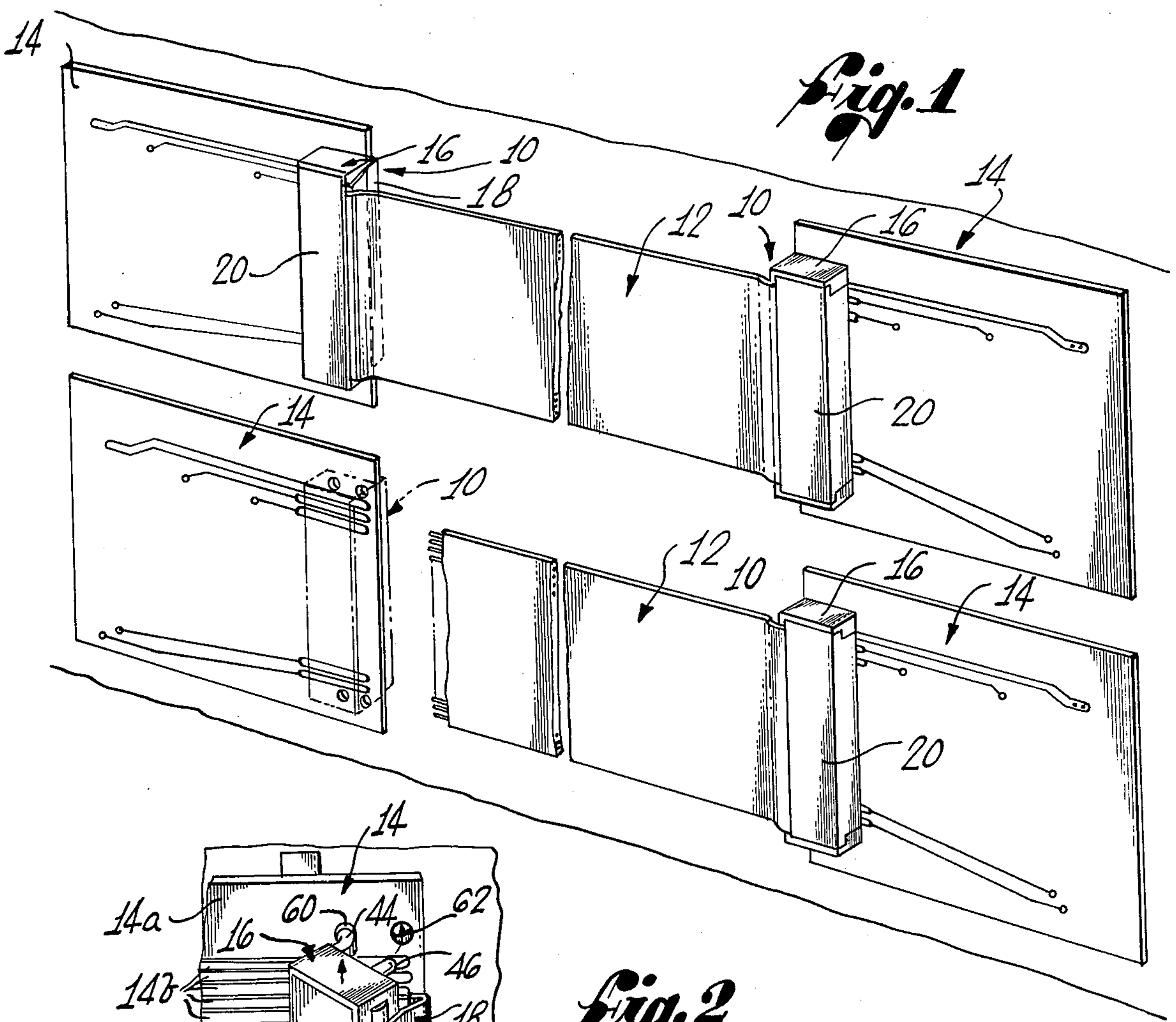
FIG. 1 is a perspective view of two pairs of connector units of this invention mating a generally flat, flexible, multi-conductor cable to a plurality of printed circuit boards.

In general, the connector unit of this invention is shown, in FIG. 1, and is designated, generally, by the numeral 10. A number of connector units 10 are shown in FIG. 1 mating several flexible, generally flat, multi-conductor cables 12 to a number of printed circuit boards 14. It will be appreciated that the relative placement of connector units to a PCB and to a flexible multiple conductor cable may achieve a variety of other forms, and the precise array and relative placement of connector units does not form part of this invention.

The connector unit 10 is generally rectangular in both longitudinal and transverse cross-section and, as best shown in FIGS. 6 and 7, has three main parts: an insulator base 16, a retention spring or spring clip 18, and an insulator cover or cap 20. The mating of the multi-conductor cable 12 to the connector unit 10 will first be described. In the particular embodiment shown, and referring in particular to FIG. 8, all conductor ends *22a*, *22b* of a multi-conductor cable 12 are first stripped of their insulator and alternate conductor ends *22a* are cut shorter than the remaining alternate conductor ends *22b* in an appropriate cutting fixture. Each of the set of alternating shorter conductor stripped ends 22a are then soldered to each of a plurality of generally C-shaped or U-shaped conductive precisely spaced spring contact members 30 while at the same time, each of the remaining set of longer perforated conductor ends 22b are soldered to an elongated bus bar strip 32. The shorter soldered conductor ends 22a are in contact only with their respective contact strips 30, and do not contact the bus bar strip 32. The longer conductor ends 22b are in contact only with bus bar strip 32. The bus bar strip 32 and the plurality of contact members 30 are initially stamped out or formed from a suitable metal alloy and are preferably formed as a single unit.

Referring now to both FIGS. 8 and 9, in particular, the bus bar 32 is provided with a reduced thickness, along line 33, thereby providing a score line whereby the bus bar 32 and the longer conductor ends 22b of cable 12 are easily severed by a cutting tool (not shown) from the adjacent shorter ends 22a and the spring contact members 30 affixed thereto.

The bus bar strip 32 functions, in most instances, as a grounding strip, and the alternate conductors of cable 12 soldered to bus bar strip 32 may thus be grounded while the remaining alternate conductors of cable 12 may carry a signal voltage, and are then known as signal lines.

After the severance of the bus bar strip 32 from the spring contact members 30 along score line 33, the bus bar strip 32, and set of alternating conductor ends 22b soldered thereto, are moved upwardly relative to the spring contact members 30 and conductor ends 22a soldered thereto, within an appropriately shaped tooling fixture (not shown) resulting in the configuration shown in FIG. 9. The multi-conductor cable 12 spring contact members 30, and bus bar strip 32 electrically connected thereto will sometimes hereinafter be referred to in the specification and claims simply as the cable assembly 13, or the multi-conductor assembly 13, to distinguish it from the multi-conductor cable 12 without the herein described bus bar and spring contact member terminations.

Referring now in particular to FIGS. 6 and 7, the upper arm or ends 34 of the spaced spring contact members 30, to which are soldered conductor ends 22a are each inserted into one of a series of generally rectangular, laterally aligned, sockets 36 provided within insulator base 16, with the lower contact end or leg 37 of each spring contact member 30 projecting below the lowermost surface 17 of the insulator base 16 when no pressure is being exerted upon the member 30. The bus bar strip 32 is placed within an elongated generally conforming channel 38 provided within the upper surface of insulator base 16, the bus bar 32 being thereby insulated and removed from the contact strips 30. Further, each of the stripped conductor ends 22b are placed within slots 39 defined by a plurality of insulating side walls 40 of the insulator base 16, so as to be insulated from each other when the bus bar strip 32 is placed within its elongated channel 38.

It will be seen from the foregoing that the insulator base 16 provides appropriate insulating walls between adjacent spring contact members 30. It is to be further noted that the upper arms 34 of each of contact members 30 is, together with its soldered conductor end 22a, biased against the upper wall of socket 36 to provide thereby, a spring loading of each contact member 30 under pressure applied against each contact leg 37 thereof.

The remaining portion of the flexible, flat, insulated multi-conductor cable 12 is then folded back over the bus bar strip 32 to extend laterally to the right of the connector unit 10, as viewed in FIG. 7.

A generally L-shaped insulating cover 20 is press fitted onto the top of the insulator base 12 by means of a pair of end pins 42, integrally affixed thereto. (See FIGS. 6 and 7) which pins 42 provide an interference fit with respect to holes provided at either end of the insulator base 16. The cover 20, together with the upper rear edge 71 of insulator base 16, defines a cable entrance slot 70 through which cable 12 passes. The cable 12 is thus precisely aligned and retained in alignment by cover 20. The cover 20 also acts as a protective housing for the conductor ends 22a, 22b and the upper ends 34 of the contact strips 30.

The alignment means and spring clip arrangement for precisely aligning a plurality of contact pad areas of a PCB with the spring contact members of the cable assembly, under a constant pressure, will now be described.

Figure 2:
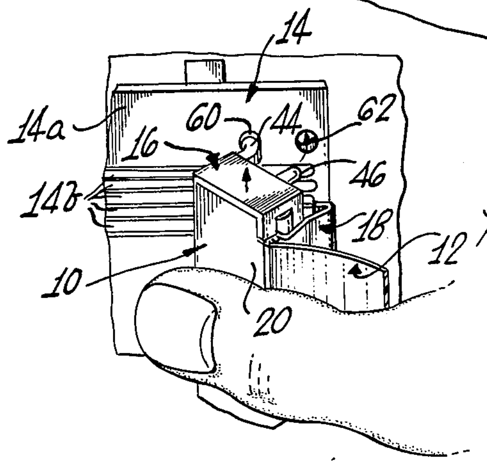
FIG. 2 is a fragmentary perspective view of the connector unit of this invention partially inserted into alignment holes of a PCB.
Figure 5:
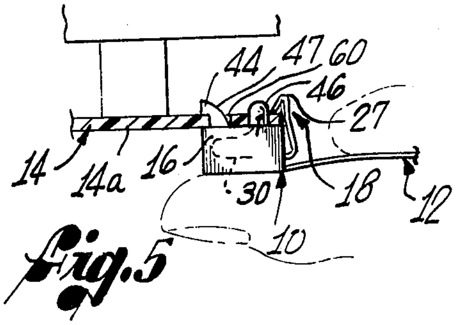
FIG. 5 is a top plan view of the connector unit of this invention, shown as in FIG. 3, fully inserted within the alignment holes of the PCB and in complete electrical engagement with the PCB.

Referring particularly to FIGS. 2, 5 and 7, the bottom surface 17 of insulator body 16 is provided with two pairs of alignment posts 44, 46, each pair of posts being preferably integrally formed at opposite ends of the insulator body 16. The retention spring clip 18 is retained within the insulator body 16 adjacent posts 46.

Each of posts 44 have one arcuately shaped, downwardly extending, surface 47, in side elevation, and have a retaining boss 48 projecting from the free end of each of the posts. The remaining pair of posts 46 extend downwardly at right angles, to the lowermost surface 17 of insulator body 16, as viewed in side elevation.

The retention spring, or spring clip 18, is preferably formed from a heat treated metal alloy, as a one-piece unit, as by a stamping operation and has a length just slightly less than the length of the connector unit 10. One end of the spring clip 18, which is designated herein as the terminal end 19, is formed as a generally elongated planar surface, or flat wall, freely insertable within an elongated spring retention slot 50 formed in the insulator body 16. The terminal end 19 of spring 18 is provided with extensions 19a formed at the outer ends thereof, each extension 19a being provided with a spring opening 21, within which the insulator cover retaining pins 42 pass and are retained within mating holes in the insulator cover 16. A tight fit is maintained between spring openings 21 and retaining pins 42 so that the terminal end 19 of the spring clip 18 is stably retained within slot 50, and stably biased against the walls defining slot 50 when pressure is exerted on the lower end 27 of spring clip 18.

The spring clip 18 has an elongated sidewall portion 23, which extends from and above the terminal end 19, and is then reversed or bent back to merge into the lower gripping portion 27 of the spring clip. An elongated lip extension, or flange 52 is integrally formed on the rear of the insulator body 16, and insulates the spring clip 18 from the cable 12. Also the flange 52 will restrict excessive pivotal movement of the spring clip 18.

The lower or gripping portion 27 of the spring clip 18 is formed with a blunt end 27a extending into a downwardly extending angular wall 27b. The wall 27b merges into the lower portion of sidewall 23, as earlier noted.

The procedure for quick-connecting the connector unit 10 and the cable assembly 13 mated thereto, will now be described with reference especially to FIGS. 2–5.

Figure 4:
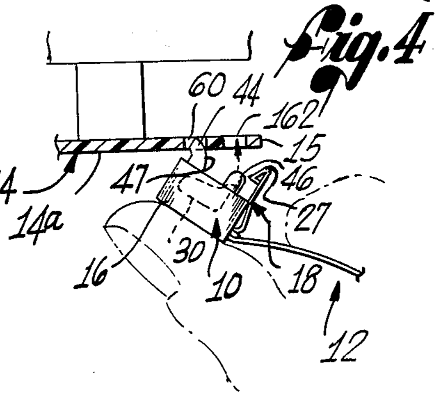
FIG. 4 is a top plan view of the connector unit of this invention, shown as in FIG. 2, partially inserted into the alignment holes of a PCB.
Figure 3:
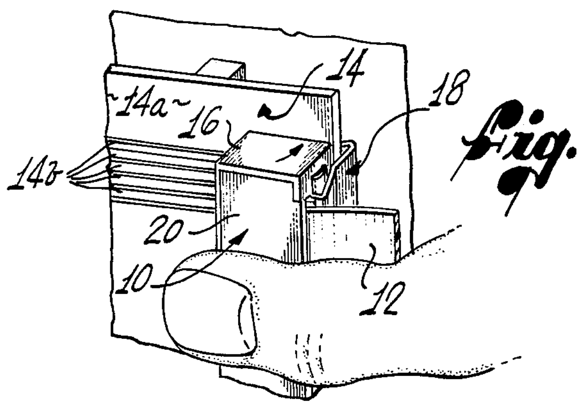
FIG. 3 is a fragmentary perspective view of the connector unit of this invention fully inserted into the alignment holes of a PCB and in full, electrical engagement with contact pad areas of the PCB.

The pair of arcuate posts 44 of connector unit 10 are first inserted into loosely fitting alignment holes 40 in the PCB on the bias, with respect to the PCB surface, as shown in FIGS. 2 and 4, using one hand only. The unit 10 is then pivoted, counterclockwise as shown in FIGS. 2–5 until the alignment posts 46 move into alignment holes 62. As the posts 46 are moved into alignment holes 62, the PCB board edge 15 angularly abuts the wall **27*b* of the gripping portion 27 of spring 18, and the gripping portion 27 is forced laterally away from the insulator base 16 and the edge 15 of the PCB (to the right in FIG. 4). As the posts 46 are moved through the alignment holes 62, the lower gripping portion 27 of the spring clip 18 moves laterally further to the right until the underside 17 of the connector unit 10 is flush with i.e., in full abutment with the PCB surface 14*a*, at which time, the gripping end 27 immediately moves laterally (to the left in FIGS. 5 and 6), under the influence of the flexed sidewall 23, to firmly grip the PCB under a uniform pressure along the length of the connector unit 10. Simultaneously, the spring contact members 30 of the cable assembly are moved from the uncompressed position shown in FIGS. 4 and 7, to the flexed or compressed position shown in phantom in FIGS. 5 and 7 and shown also in solid line in FIG. 6, due to the compressive force exerted by the elongated spring clip 18**.

The combination of precisely aligned spring-loaded contact members 30, biased within the connector unit 10, and the spring loading provided by the spring clip biased within slot 50 of insulator base 16, assure a constant uniform pressure between contact members 30 and PCB contact pad areas **14*b*, which uniform pressure is reproducible even after multiple quick-connects and quick-disconnects of the connector unit 10 to the PCB 14**.

The connector unit and cable assembly may be disengaged from the PCB with one hand only and with no special tooling, by exerting a lateral force directed away from the PCB edge 15 (to the right in FIG. 5) at which time the gripping portion 27 will be backed off the PCB and the connector unit 10 may be readily rotated away from the PCB (clockwise as viewed in FIG. 5) until the alignment posts 46, 44 are removed from the respective alignment openings 62, 60 in the PCB.

Repeated quick-connects and quick-disconnects can be made with the connector unit 10 of this invention with relatively low impact force upon the contact pad areas **14*b* of the PCB 14** as compared to that of the conventional edge-type PCB connector.

The minimum contact pressure desired between contact pad areas **14*b* and spring contact members 30 can be designed for the thinnest PCB desired, e.g., 0.044 inches. and a spring clip 18 of the appropriate metal or metal alloy and thickness, need only be selected. If then, a somewhat thicker PCB is to be mated to the connector unit 10 and associated cable assembly, e.g., of 0.067 inches, the same spring clip 18** may be employed and will engage the PCB under a greater contact pressure than with that of the thinner PCB.

The elongated sidewall 23 as well as the elongated, unitary design of the spring clip 18 serves to reinforce the lower end 27 thereof to render, as uniformly as possible, the contact pressure of contact members 53 of connector unit 10 to all contact pad areas **14*b* of the PCB 14. Any warpage of the PCB will tend to be straightened under the influence of the elongated spring clip 18**.

It will be understood that, while in the specific embodiment shown, an alternating ground-signal-ground-signal configuration has been shown, other configurations are utilized such as signal-ground-signal-ground lines, or all signal lines. In the particular embodiment shown, a ground line may be readily soldered, or otherwise electrically connected, to the next adjacent signal line, if the electrical circuit so requires.

The insulator base 16 and insulator cover 20 are preferably made, of a flame retardant thermoplastic such as a 20% glass-filled polyester. The spring contact member 30 and ground strip 32 are, it will be recalled, initially formed as a unitary piece, and are preferably made of a high tensile strength conductive material such as plated Grade A phosphor-bronze alloy of an initial thickness of 0.0150 inches. The plating may be of a 60–40 tin-lead alloy of 150 to 250 micro-inches thickness. The retention spring, or spring clip 18, is preferably made of a Beryllium Copper, Alloy 25 of 0.0090 inch thickness and is heat treated after stamping and forming.

A typical PCB may have some 22 or more contact pad areas **14*b*, each pad having a width of about 0.055 inches and being spaced from the next adjacent pad area by a distance of 0.020 inches. The overall length of the connector unit 10 is only slightly greater than that of the overall length of the PCB contact areas 14*b*, each spring contact member 30 having a width exactly equal to each contact pad area width, and having a spacing between adjacent members 30 exactly equal to the spacing between adjacent contact pads 14*b*.** The PCB thickness may vary by as much as a 40% in thickness, e.g., from 0.047 inch thickness to 0.067 inch thickness.

While certain embodiments of the invention have been shown and described herein, other embodiments failling within the scope of the invention will occur to those skilled in the art. The invention is limited only by the claims which follow.

I claim:

1. A multiple contact connector unit for electrically connecting a printed circuit board, having multiple electrical contact pad areas, to a flexible normally flat, multi-conductor cable which comprises:

an insulator base having multiple, insulated, laterally aligned, socket means therein extending along substantially the entire length of said insulated base for biasing multiple spring contact members within said insulator base;

pivotal alignment means, affixed to said insulator base, for pivotally mounting said connector unit to said printed circuit board and accurately aligning said connector unit, in a predetermined manner, with said printed circuit board;

an insulator cover;

means to affix said insulator cover to said insulator base, said cover together with said insulator base defining a laterally extending entrance slot therebetween through which said multi-conductor cable may pass and be fixed in place relative to said socket means of said insulator base; and an elongated retention spring, a first end of which extends along substantially the entire length of said insulator base and is affixed thereto, and the other end of which has an elongated gripping portion extending below the lowermost surface of said insulator base, said elongated gripping portion having a length which extends substantially the entire length of said insulator base and which also extends across the entire length of said laterally aligned multiple socket means biasing said multiple spring contact members, said elongated gripping portion being displaced from said insulation base as said connector unit is pivotally mounted onto said printed circuit board but clamping said printed circuit board to said insulator base under a predetermined and substantially uniform contact pressure to thereby urge spring contact members to be contained in said socket members into substantially uniform pressurized electrical contact with said contact pad areas of said printed circuit board after said connector unit and printed circuit board are in full abutment with each other.

2. The connector unit of claim 1 wherein said pivotal alignment means includes a first pair of posts, each having downwardly extending arcuate surfaces, as viewed in side elevation for pivotally mounting said connector unit to mating holes in a printed circuit board.

3. The connector unit of claim 2 wherein each of said first pair of posts has a retaining boss formed thereon at the free end of each of said posts.

4. The connector unit of claim 1 wherein said pivotal alignment means includes a first pair of posts, each having downwardly extending arcuate surfaces, as viewed in side elevation for pivotally mounting said connector unit to mating holes in a printed circuit board and further includes another pair of downwardly extending alignment posts adjacent said first pair of posts.

5. The connector unit of claim 1 wherein said means to affix said insulator cover to said insulator base comprises a plurality of projecting pins affixed to said insulator cover and adapted for interference fit with mating holes formed in said insulator base.

6. The connector unit of claim 1 wherein said first end of said elongated retention spring is stably mounted within a slot formed in said insulator base.

7. The connector unit of claim 6 wherein said first end of said elongated retention spring is stably biased against the walls of said slot formed in said insulator base.

8. The connector unit of claim 1 wherein said elongated retention spring is a unitary member having flexing sidewall connected to said first end, said elongated gripping portion merging into said flexing sidewall, said first end of said retention spring being stably retained within a slot of said insulator base, and said gripping portion having a downwardly sloping face forming an obtuse angle with said lowermost surface of said insulation base, as viewed in side elevation, whereby said gripping portion is readily displaced from said insulator base as said connector unit is pivotally mounted onto said printed circuit board.

9. The connector unit of claim 1 wherein said insulator base is provided with an elongated lip extension formed between said cable entrance slot and said elongated retention spring whereby said multi-conductor cable is insulated from said elongated retention spring.

10. The connector unit of claim 1 wherein said means to affix said insulator cover to said insulator base comprises a plurality of projecting pins affixed to said insulator cover and adapted for interference fit with mating holes formed in said insulator base;

and said first end of said elongated retention spring is provided with mating openings for said projecting pins to stably mount said first end of said elongated retention spring by means of the interfit between said projecting pins and mating openings, as said insulator cover is affixed to said insulator base.

11. The connector unit of claim 1 wherein said first end of said elongated retention spring is mounted within a slot formed in said insulator base, and said means to affix said insulator cover to said insulator base also stably biases said first end of said elongated retention spring against the walls defining said slot formed in said insulator base.

12. In combination, a flexible, multi-conductor cable and a multiple contact connector unit for electrically connecting a printed circuit board, having multiple electrical contact pad areas, to said multi-conductor cable which comprises:

a flexible, normally flat, multi-conductor cable having stripped ends;

multiple spring contact members affixed to at least some of the stripped ends of said multi-conductor cable;

an insulator base having muliple, insulated, laterally aligned socket means therein extending along the length thereof, each socket means stably biasing each of said multiple spring contact members, in an insulated manner, within said insulator base;

pivotal alignment means, affixed to said insulator base, for pivotally mounting said connector unit to said printed circuit board and accurately aligning said connector unit, in a predetermined manner, with said printed circuit board;

an insulated cover;

means to affix said insulator cover to said insulator base, said cover together with said insulator base defining a laterally extending entrance slot therebetween said multi-conductor cable extending through said entrance slot and being fixed in place, by said entrance slot, relative to said socket means of said insulator base; and an elongated retention spring, a first end of which extends along substantially the entire length of said insulator base, and is affixed thereto, and the other end of which has an elongated gripping portion extending below the lowermost surface of said insulator base, said elongated gripping portion having a length which extends substantially the entire length of said insulator base, and which also extends across the entire length of said laterally aligned multiple socket means containing said biased multiple spring contact members, said elongated gripping portion being displaced from said insulator base as said connector unit is pivotally mounted onto said printed circuit board but clamping said printed circuit board to said insulator base under a predetermined contact pressure to thereby urge spring contact members, contained in said socket members, into substantially uniform pressurized electrical contact with said contact pad areas of said printed circuit board after said connector unit and printed circuit board are in full abutment with each other.

13. The combination of claim 12 including a bus bar contained within said connector unit, some of said stripped ends of said multi-conductor cable being affixed to said spring contact members, and the remaining stripped ends of said multi-conductor cable being electrically connected only to said bus bar.

14. The combination of claim 12 including a bus bar contained within said connector unit, alternate stripped ends of said multi-conductor cable being affixed to said spring contact members, and the remaining stripped ends of said multi-conductor cable being electrically connected only to said bus bar.

15. The connector unit of claim 12 wherein said pivotal alignment means includes a first pair of posts, each having downwardly extending arcuate surfaces, as viewed in side elevation for pivotally mounting said connector unit to mating holes in a printed circuit board.

16. The connector unit of claim 15 wherein each of said first pair of posts has a retaining boss formed thereon at the free end of each of said posts.

17. The connector unit of claim 12 wherein said pivotal alignment means includes a first pair of posts, each having downwardly extending arcuate surfaces, as viewed in side elevation for pivotally mounting said connector unit to mating holes in a printed circuit board and further includes another pair of downwardly extending alignment posts adjacent said first pair of posts.

18. The connector unit of claim 12 wherein said means to affix said insulator cover, to said insulator base comprises a plurality of projecting pins affixed to said insulator cover and adapted for interference fit with mating holes formed in said insulator base.

19. The connector unit of claim 12 wherein said first end of said elongated retention spring is stably mounted within a slot formed in said insulator base.

20. The connector unit of claim 19 wherein said first end of said elongated retention spring is stably biased against the walls of said slot formed in said insulator base.

21. The connector unit of claim 12 wherein said elongated retention spring is a unitary member having a flexing sidewall connected to said first end, said elongated gripping portion merging into said flexing sidewall, said first end of said retention spring being stably retained within a slot of said insulator base, and said gripping portion having a downwardly sloping face forming an obtuse angle with said lowermost surface of said insulation base, as viewed in side elevation, whereby said gripping portion is readily displaced from said insulator base as said connector unit is pivotally mounted onto said printed circuit board.

22. The connector unit of claim 12 wherein said insulator base is provided with an elongated lip extension formed between said cable entrance slot and said elongated retention spring whereby said multi-conductor cable is insulated from said elongated retention spring.

23. The connector unit of claim 12 wherein said means to affix said insulator cover to said insulator base comprises a plurality of projecting pins affixed to said insulator cover and adapted for interference fit with mating holes formed in said insulator base;

and said first end of said elongated retention spring is provided with mating openings for said projecting pins to stably mount said first end of said elongated retention spring by means of the interfit between said projecting pins and mating openings, as said insulator cover is affixed to said insulator base.

24. The connector unit of claim 12 wherein said first end of said elongated retention spring is mounted within a slot formed in said insulator base, and said means to affix said insulator cover to said insulator base also stably biases said first end of said elongated retention spring against the walls defining said slot formed in said insulator base.

* * * * *